United States Patent [19]
Chen

[11] Patent Number: 5,307,028
[45] Date of Patent: Apr. 26, 1994

[54] PHASE-AND-FREQUENCY MODE/PHASE MODE DETECTOR WITH THE SAME GAIN IN BOTH MODES

[75] Inventor: Dao-Long Chen, Fort Collins, Colo.

[73] Assignee: NCR Corporation, Dayton, Ohio

[21] Appl. No.: 961,975

[22] Filed: Oct. 16, 1992

[51] Int. Cl.$^5$ ..................... H03L 7/087; H03D 13/00
[52] U.S. Cl. ..................... 331/1A; 331/25; 307/527; 307/528; 328/133; 360/51
[58] Field of Search ............... 331/1 A, 10, 11, 16, 331/25, DIG. 2; 307/510, 516, 525, 526, 527, 528; 328/133, 134; 375/120; 360/51

[56] References Cited

U.S. PATENT DOCUMENTS

| | | | |
|---|---|---|---|
| 4,894,734 | 1/1990 | Fischler et al. | 360/51 |
| 5,162,746 | 11/1992 | Ghoshal | 328/133 X |
| 5,170,297 | 12/1992 | Wahler et al. | 360/51 |

OTHER PUBLICATIONS

"Phaselock Techniques", by Floyd M. Gardner, John Wiley & Sons, 1979.

"Phase-Locked Loops-Theory, Design & Applications", by Dr. Roland E. Best, Mc Graw-Hill, 1984.

Primary Examiner—David Mis
Attorney, Agent, or Firm—Paul W. Martin

[57] ABSTRACT

A dual-mode detector which has phase-detection and phase-and-frequency-detection modes of operation, each mode of operation having the same gain. The detector includes a detection and feedback circuit for detecting phase and frequency differences, and for generating first and second feedback signals for controlling the voltage-controlled oscillator in response to the phase and frequency differences. A mode-switching circuit switches the detection and feedback circuit between the phase-detection and the phase-and-frequency-detection modes of operation. A programmable delay circuit delays signals from the mode-switching circuit and provides delayed signals to the detection and feedback circuit. Finally, an optional edge detection circuit converts predetermined data signals to a format recognizable by the detection and feedback circuit.

36 Claims, 5 Drawing Sheets

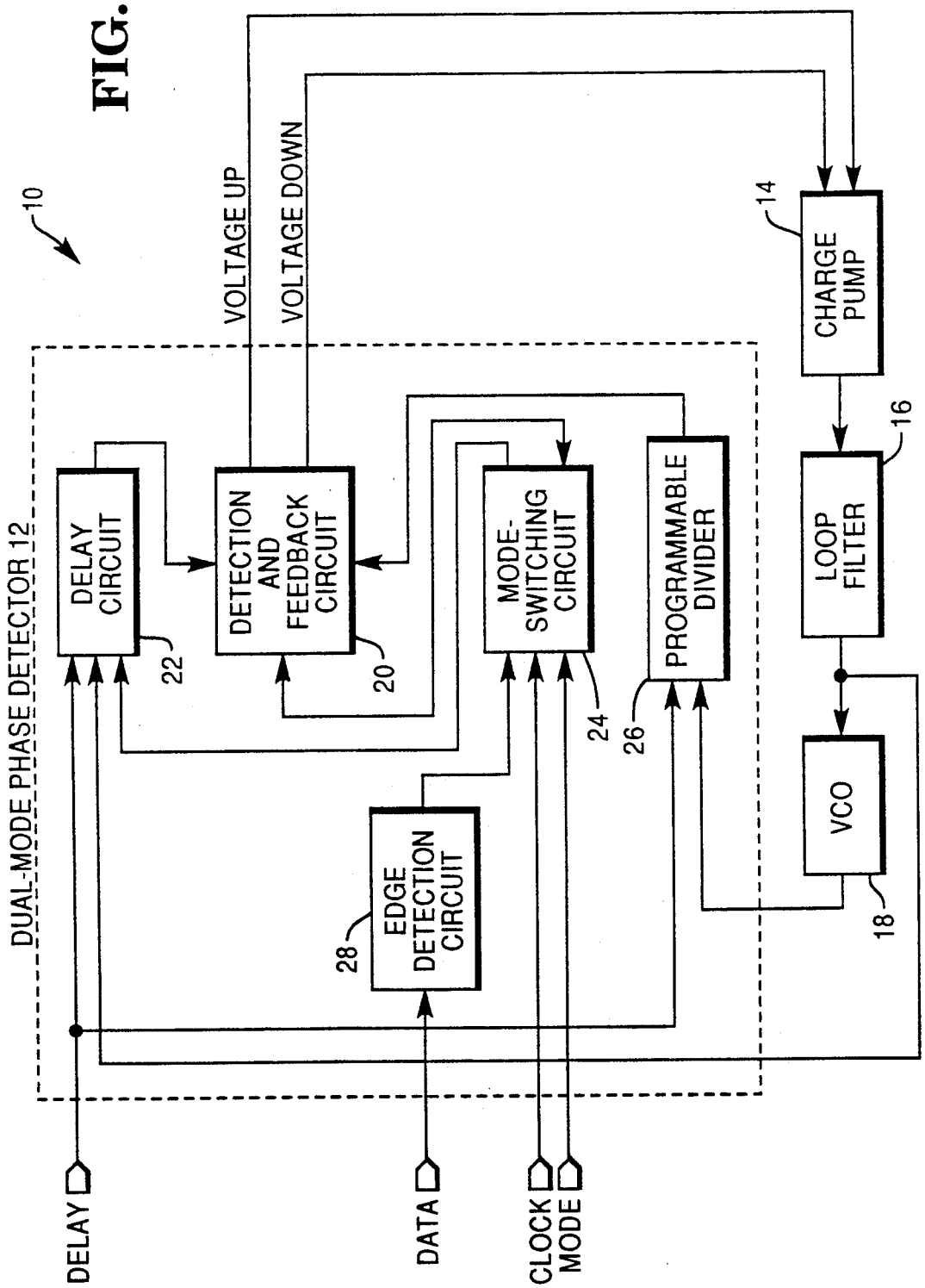

PHASE-AND-FREQUENCY MODE/PHASE MODE DETECTOR WITH THE SAME GAIN IN BOTH MODES

BACKGROUND OF THE INVENTION

The present invention relates to phase-locked loop circuitry, and more specifically to a phase-and-frequency mode/phase mode detector with the same gain in both modes.

Phase-locked loop (PLL) circuits are widely used in electronic systems for clock recovery, frequency synthesis, and many other applications. PLL circuits are discussed in the following references:

1. "Phaselock Techniques", by Floyd M. Gardner, John Wiley & Sons, 1979.
2. Phase-locked Loops-Theory, Design, and Applications, by Dr. Roland E. Best, McGraw-Hill, 1984.

These references are hereby incorporated by reference.

A phase detector is usually required to compare the phase difference between a PLL clock signal and a reference signal. The requirements of a phase detector are determined by its application. For example, in a PLL circuit for frequency synthesis, the phase detector must also be able to detect frequency differences before measuring phase differences. However, in other applications, a phase-only detector may be required if the input reference signal is not a periodic waveform.

For example, for clock recovery in the read channel of a disk drive, a PLL circuit must lock to a crystal clock source during the initial power-up period or during the period in which the drive is not reading data from the disk. Since it is possible to have the PLL circuit driven out of frequency lock by a write-splice, it is important for the PLL circuit to be able to detect both phase and frequency difference during those periods. When the disk drive starts reading data, the PLL circuit has to remain locked at the crystal clock frequency. If the industry standard Modified Frequency Modulation (MFM) encoding scheme is employed, the frequency of the data may vary by a factor of two. Since the rising edge of the data pulse is located at the center of a bit cell and the rising edge of the clock pulses are located at the beginning of a bit cell, the frequency of the PLL clock signal must be twice the data rate. Thus, to avoid locking to the sub-harmonics of the crystal frequency, a phase-only detector must be used when the drive is reading data from the disk.

A common solution to the problem is to switch between two phase detectors in the PLL circuit: a phase-only detector and a phase-and-frequency detector. However, it is difficult to design a PLL circuit with two phase detectors, since the gains of the detectors may not be the same. Consequently, a complicated circuit may be required to compensate for the difference in detector gains.

Therefore, it would be desirable to produce a phase detector which may be used for both phase-only and phase-and-frequency operation and whose gain does not change when switched from one mode to the other.

SUMMARY OF THE INVENTION

In accordance with the teachings of the present invention, a dual-mode detector is provided. The detector includes a detection and feedback circuit for detecting phase and frequency differences between a clock signal and an output signal from a voltage-controlled oscillator in the phase-and-frequency-detection mode, for detecting phase differences between a data signal and the output signal from the voltage-controlled oscillator in the phase-detection mode, and for generating first and second feedback signals for controlling the voltage-controlled oscillator in response to the phase and frequency differences. A mode-switching circuit switches the detection and feedback circuit between the phase-detection and the phase-and-frequency-detection modes of operation. A programmable delay circuit delays signals from the mode-switching circuit and provides delayed signals to the detection and feedback circuit. Finally, an optional edge detection circuit converts predetermined data signals to a format recognizable by the detection and feedback circuit.

It is a feature of the present invention that the dual-mode detector of the present invention has two modes of operation, a phase-detection mode and a phase-and-frequency-detection mode.

It is another feature of the present invention that the gain of the dual-mode detector is the same for each operating mode.

It is another feature of the present invention that the dual-mode detector recognizes a plurality of different data formats.

It is yet another feature of the present invention that the dual-mode detector includes programmable delay.

It is accordingly an object of the present invention to provide dual-mode detector.

It is another object of the present invention to provide a dual-mode detector which has a phase-detection mode of operation and a phase-and-frequency-detection mode of operation.

It is another object of the present invention to provide a dual-mode detector having a gain which is the same for each operating mode.

It is yet another object of the present invention to provide a dual-mode detector which is universal in application, being able to accept a plurality of different data formats and a plurality of different data rates.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

FIG. 1 is a block diagram of a phase-locked loop (PLL) circuit containing the dual-mode detector of the present invention;

DETAILED DESCRIPTION OF THE PREFERRED EMBODIMENT

Figure 2A:
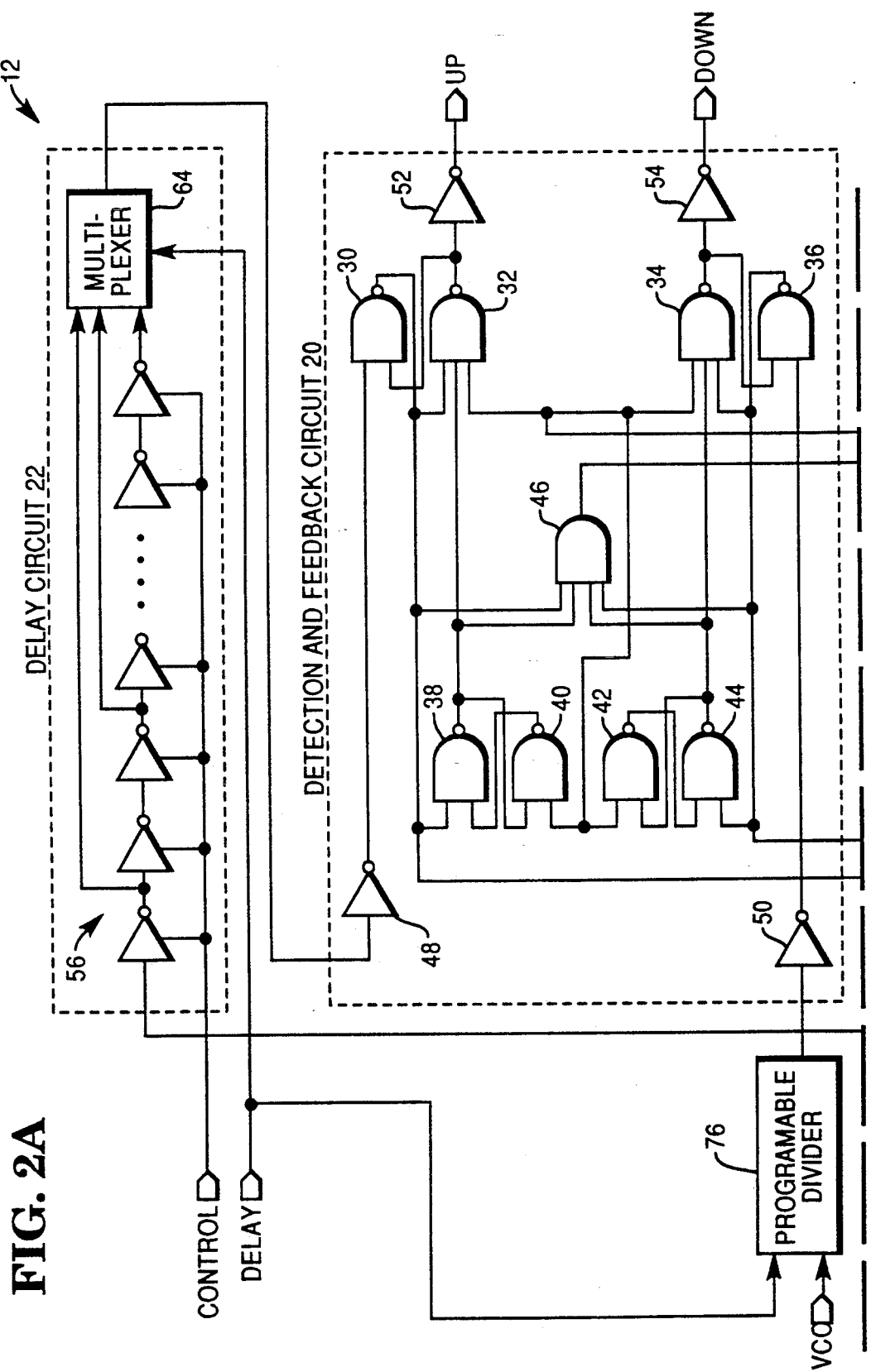
FIGS. 2A and 2B form a schematic diagram of the dual-mode detector of the present invention.

Referring now to FIG. 1, PLL circuit 10 includes dual-mode detector 12, charge pump 14, loop filter 16, and voltage-controlled oscillator (VCO) 18.

Dual-mode detector has a phase-detection mode and phase-and-frequency-detection mode. In the phase-detection mode, dual-mode detector 12 detects a phase difference between a PLL clock signal (PLL clock) and an incoming data signal (data). The data signal may be encoded in one of many formats, such as an MFM data signal. In the phase-and-frequency-detection mode, dual-mode detector 12 detects a phase and a frequency difference between the PLL clock signal and a crystal clock signal (clock) in order to become locked at the crystal clock frequency. In either mode, dual-mode detector 12 produces "voltage up" and "voltage down" feedback signals for causing VCO 18 to stabilize at a constant frequency.

Dual-mode detector 12 includes detection and feedback circuit 20, delay circuit 22, mode-switching circuit 24, programmable divider 26, and optional edge-detection circuit 28. Detection and feedback circuit 20 detects phase differences and generates the voltage up and voltage down signals.

Delay circuit 22 delays the data signal when the clock signal leads the data signal in order to allow detection and feedback circuit 20 to detect a phase difference. Preferably, delay is selectable.

Mode-switching circuit 24 switches dual-mode detector 12 between phase-detection and phase-and-frequency-detection modes of operation.

Programmable divider 26 divides the output signal from VCO 18 by a predetermined number in order to produce a predetermined PLL clock frequency. The predetermined number is determined by the amount of delay selected. Programmable divider 26 may be any commercially available divide-by-n circuit. Preferably, delay is about one fourth of a bit cell for MFM data, which means that the predetermined number is four.

Edge-detection circuit 28 may be necessary to convert certain data formats to a format that dual-mode detector 12 can process.

VCO 18 produces an output signal whose frequency varies with input voltage. Preferably, VCO 18 is a high-speed ring oscillator based on a differential amplifier design, which provides a high degree of noise immunity and a good output duty cycle. Delay is inherent in such a design and must be considered when programming delay circuit 22.

Loop filter 16 contains capacitive elements which control the voltage input to VCO 18 in response to voltage up and voltage down signals from dual-mode detector 12.

Charge pump 14 receives voltage up and voltage down corrective feedback signals from dual-mode detector 12. It charges and discharges capacitive elements within loop filter 16 in response to voltage up and voltage down signals, in order to lock the PLL clock frequency to the crystal clock frequency in the phase-and-frequency-detection mode, and to lock the rising edge of the PLL clock signal to the rising edge of the data signal in the phase-detection mode.

Turning now to FIGS. 2A abd 2B, dual-mode detector 12 is shown in more detail. Detection and feedback signal circuit 20 is similar to the circuit found in the incorporated reference by Best on page 8, Table 2-1, and includes NAND gates 30-44, AND gate 46, and inverters 48-54. NAND gates 38 and 40, and 42 and 44 form SR-type flip-flops. PLL clock signal couples to dual-mode detector through inverter 50. Delayed data signal (phase-detection mode) and crystal clock signal (phase-and-frequency-detection mode) couple to inverter 48. Voltage up and voltage down signals output from inverters 52 and 54. Operation of detection and feedback circuit 20 may be found in the incorporated reference.

Figure 3:
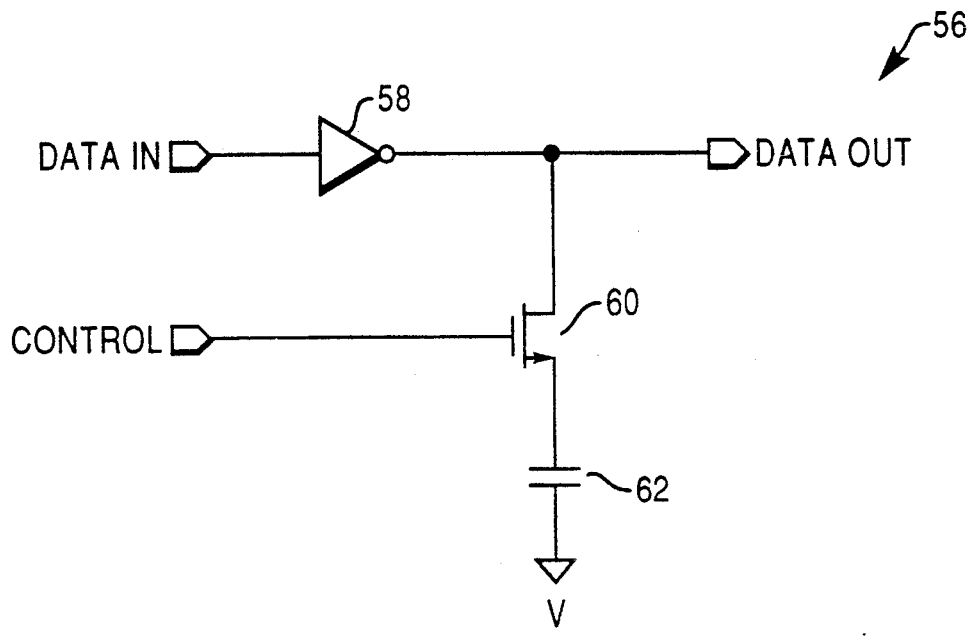
FIG. 3 is a schematic diagram of a particular type of delay cell within the delay circuit of the dual-mode detector.

Delay circuitry 22 may be any circuit for delaying a signal, although the preferred design includes a series of delay cells 56. A preferred delay cell 56 is based on an amplifier design and includes inverter 58, transistor 60, and capacitor 62 (FIG. 3). Data signal (phase-detection mode) and crystal clock signal (phase-and-frequency-detection mode) couple to inverter 58. The output voltage of loop filter 16 couples to transistor 60. Here, transistor 60 is a field-effect transistor (FET), with the output voltage of loop filter 16 being coupled to the gate of the FET.

Delay is programmable by selecting one of the outputs of multiplexer 64. For example, for a four-input multiplexer 64, a two-bit input is required. The amount of delay is determined by the data rate, the encoding scheme, and allowable phase jitter in the data stream. For MFM data, a delay of one-fourth of the bit cell period of the data signal may be employed to achieve the maximum allowable phase jitter.

Since delay circuit 22 is controlled by the same voltage that controls the output frequency of VCO 18, the delay is proportional to the period of the VCO output signal. For example, if the data signal is formatted as an MFM data signal, the PLL clock signal may have a frequency that is twice the frequency of the data signal. Thus, for a 5-cell VCO, a 10-cell delay circuit would be required to produce a delay equal to the period of VCO 18.

Mode-switching circuitry 24 includes multiplexer 66, D-type flip-flop 68, NAND gate 70, and NOR gates 72 and 74. Mode signal controls multiplexer 66 and couples to NOR gate 72. Output Q of D-type flip-flop 68 couples to NOR gate 72 as well. D-type flip flop 68 is coupled to crystal clock or data signal through multiplexer 66. D-type flip-flop 68 is reset by a signal from NAND gate 70. The data input is coupled to voltage $V_{DD}$. NAND gate 70 receives data edge and clock edge signals from detection and feedback circuit 20. Data edge signal is generated by NAND gate 30, while clock edge signal is generated by NAND gate 36. NOR gate 74 receives inputs from NOR gate 72 and AND gate 46. NOR gate 74 outputs to NAND gates 32 and 34.

Figure 4:
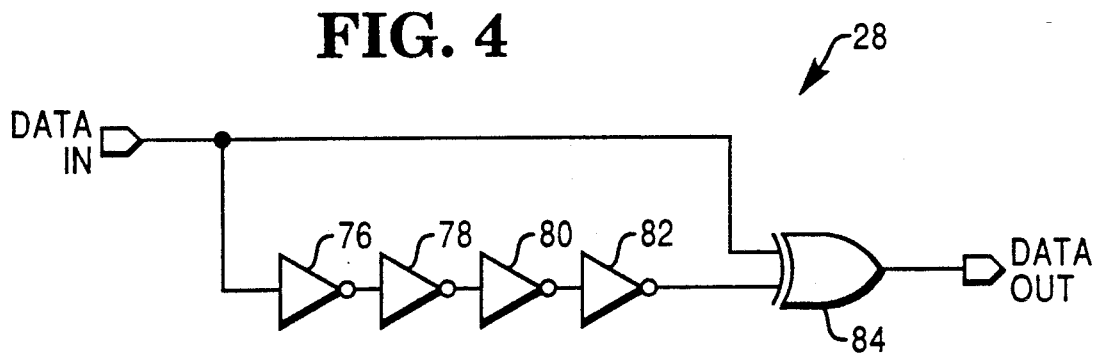
FIG. 4 is a schematic diagram of an edge-detection circuit for allowing the dual-mode detector to operate with other data formats.

Edge-detection circuitry 28 is not necessary for processing MFM formatted data. For formats such as NRZ, NRZI, or bi-phase formatted data, which have timing information embedded in both edges, edge-detection circuit 28 includes inverters 76-82 and exclusive nor (EX-NOR) gate 84 (FIG. 4) for generating a short pulse which has rising and falling edges which can be easily detected by mode-switching circuitry 24.

Figure 2B:
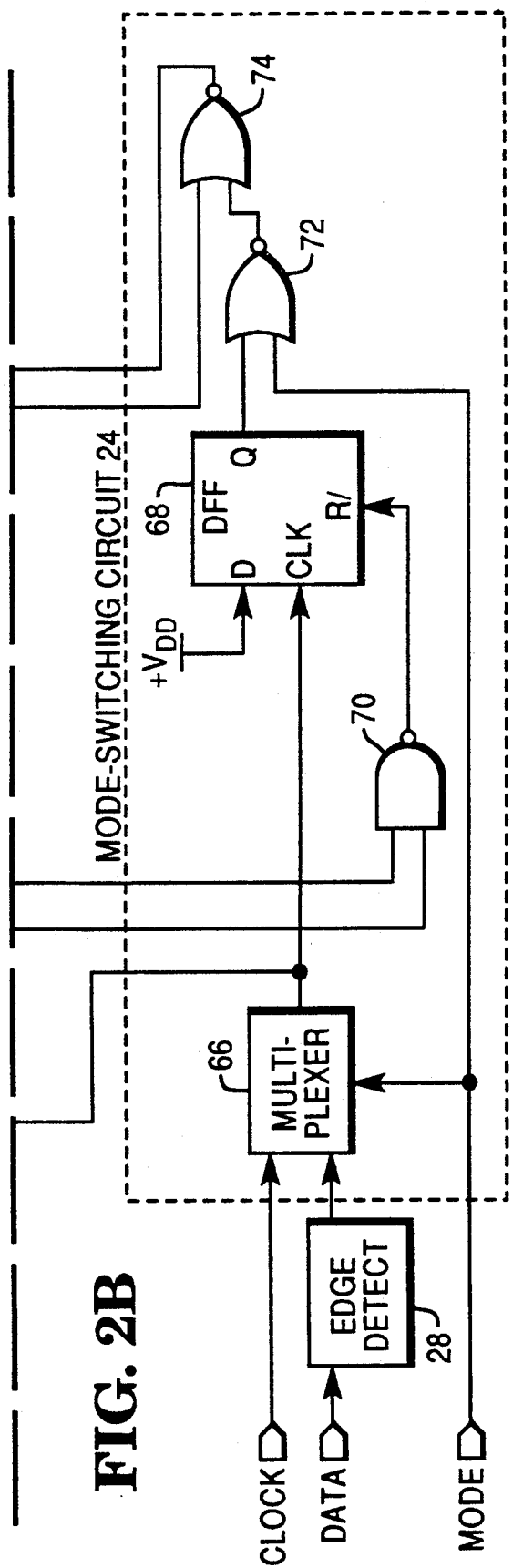

Turning now to FIGS. 5-8, the operation of dual-mode detector 12 may be understood by comparing signals at various points in the circuit of FIG. 2. In the phase-detection mode (MODE signal is at logical "0" state), dual-mode detector 12 is enabled when there is a rising edge in the incoming data stream. The output of multiplexer 66 switches to data signal. A rising edge in the data stream causes the "enable" signal from NOR gate 72 to be asserted. When the "data edge" signal from NAND gate 30 and "clock edge" signal from NAND gate 36 are asserted, the phase comparison is complete for the current bit cell and the "enable" signal is deasserted. Dual-mode detector 12 then awaits the next rising edge of the data signal.

Since the phase comparison is triggered by the rising edges of the data stream, a missing pulse in the bit cell, which is equivalent to a frequency difference, will be ignored when dual-mode detector 12 is in the phase-detection mode.

Dual-mode detector 12 is in the phase-and-frequency-detection mode when the mode signal is asserted (MODE signal is at logical "1" state). The output of NOR gate 72 is low because mode signal is high. Thus, standard phase-locked loop operation occurs as only the output of AND gate 46 determines the output of NOR gate 74. Mode-switching circuit 24 is effectively disabled.

Dual-mode detector 12 may be switched to the phase-detection mode by deasserting the mode signal (logic "0" state). Switching from the phase-detection mode to the phase-and-frequency-detection mode preferably occurs automatically. Data edge and clock edge signals from the outputs of NAND gates 30 and 36 reset D-type flip-flop 68 through NAND gate 70.

Figure 5:
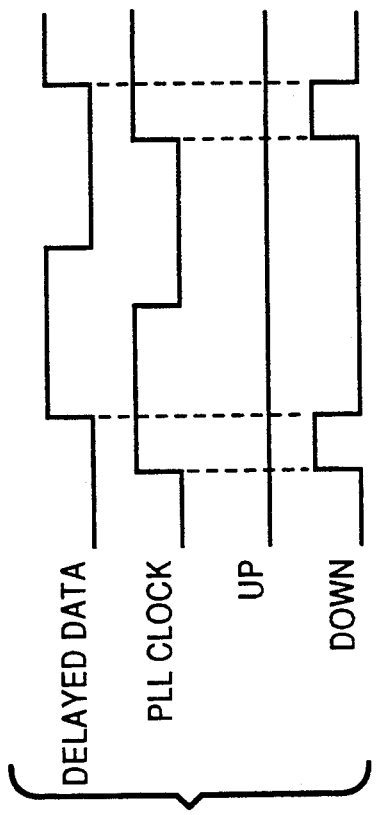
FIG. 5 is a first timing diagram illustrating operation of the dual-mode detector.

FIG. 5 illustrates the case in which the clock signal lags the data signal and the data and clock signals have the same frequency. Phase difference can be measured since the rising edge of the clock signal occurs after dual-mode detector 12 is enabled by the rising edge of the data signal.

Figure 6:
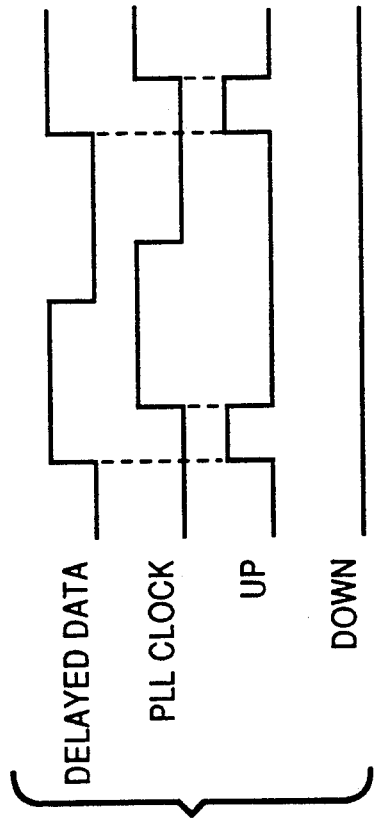
FIG. 6 is a second timing diagram illustrating operation of the dual-mode detector.

FIG. 6 illustrates the case in which the clock signal leads the data signal in phase and the data and clock signals have the same frequency. The phase difference cannot be measured because dual-mode detector 12 has not been enabled. Therefore, the data signal is delayed by delay circuit 22 and the phase difference between the delayed data signal and the PLL clock signal is measured.

Figure 7:
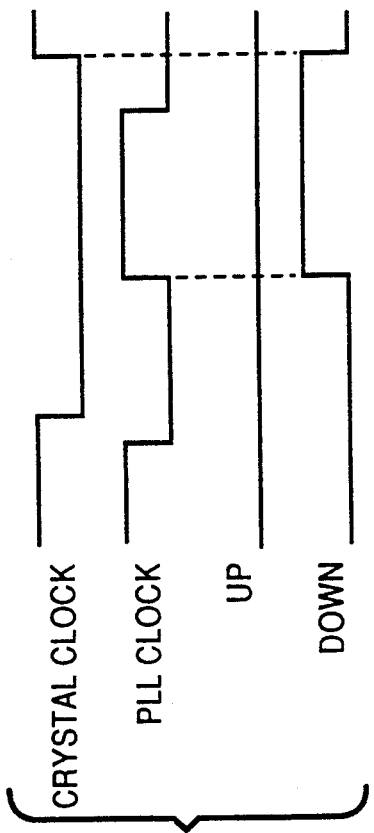
FIG. 7 is a third timing diagram illustrating operation of the dual-mode detector.
Figure 8:
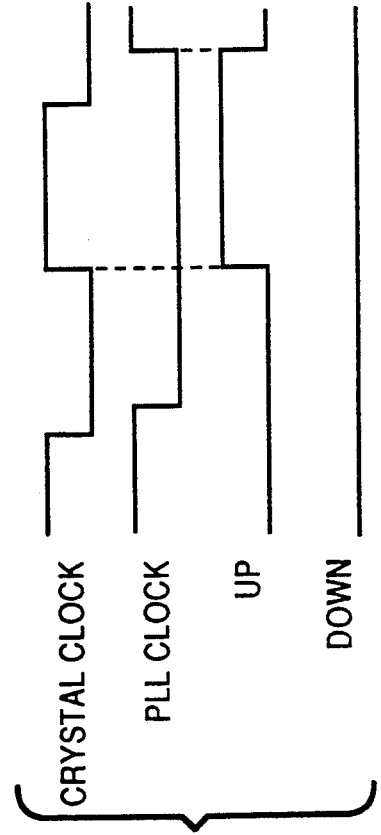
FIG. 8 is a fourth timing diagram illustrating operation of the dual-mode detector.

FIGS. 7 and 8 represent normal phase-locked loop operation in the phase-and-frequency-detection mode of operation. FIG. 7 illustrates the case in which the PLL clock signal lags the crystal clock signal and the PLL clock and crystal clock signals have different frequencies.

FIG. 8 illustrates the case in which the PLL clock signal leads the crystal clock signal and the PLL clock and crystal clock signals have different frequencies.

Although the present invention has been described with particular reference to certain preferred embodiments thereof, variations and modifications of the present invention can be effected within the spirit and scope of the following claims.

What is claimed is:

1. A dual-mode detector which has a phase-detection mode of operation and a phase-and-frequency-detection mode of operation;
   wherein the dual-mode detector has a first gain while in the phase-detection mode and a second gain while in the phase-and-frequency-detection mode; and
   wherein the first and second gains are the same.

2. The dual-mode detector as recited in claim 1, being part of a phase-locked loop circuit having a voltage-controlled oscillator, the dual-mode detector comprising:

first circuit means for detecting phase differences between a first signal and a signal from the voltage-controlled oscillator during the phase-detection mode, for detecting phase and frequency differences between a second signal and the signal from the voltage-controlled oscillator during the phase-and-frequency-detection mode, and for generating first and second feedback signals for controlling the voltage-controlled oscillator in response to the phase and frequency differences; and second circuit means for switching the first circuit means between the phase-detection and the phase-and-frequency-detection modes of operation.

3. The dual-mode detector as recited in claim 2, wherein the first signal is a data signal and the second signal is a clock signal.

4. The dual-mode detector as recited in claim 3, further comprising:
   third circuit means for delaying signals from the second circuit means and for providing delayed signals to the first circuit means.

5. The dual-mode detector as recited in claim 4, wherein the third circuit means is programmable.

6. The dual-mode detector as recited in claim 4, further comprising:
   fourth circuit means for converting predetermined data signals to a format recognizable by the first circuit means.

7. The dual-mode detector as recited in claim 2, wherein the first circuit means comprises:
   a first NAND gage having first and second inputs and an output, the first input being either the first or second signal;
   a second NAND gate having first, second, and third inputs and an output, the first input being the output of the first NAND gate, and the output being the first feedback signal and the second input of the first NAND gate;
   a first RS-type flip-flop having an input, a reset, and an output, the input being the output of the first NAND gate, the output being the second input of the second NAND gate, and the reset being the third input of the second NAND gate;
   a third NAND gate having first and second inputs and an output, the first input being the output of the voltage-controlled oscillator;
   a fourth NAND gage having first, second, and third inputs and an output, the first input being the output of the third NAND gate, and the output being the second feedback signal and the second input of the third NAND gage;
   a second RS-type flip-flop having an input, a reset, and an output, the input being the output of the third NAND gate, the output being the second input of the fourth NAND gate, and the reset being the third input of the second and fourth NAND gates; and
   an AND gate having first, second, third, and fourth inputs and an output, the first input being the output of the first NAND gate, the second input being the output of the first RS-type flip-flop, the third input being the output of the second RS-type flip-flop, the fourth input being the output of the third NAND gate, and the output being the third input of the second and fourth NAND gates.

8. The dual-mode detector as recited in claim 7, wherein the second circuit means comprises:

a multiplixer having first, second, and mode select inputs and an output, the first input being the first signal, the second input being the second signal, and the output being the first input to the first NAND gate of the first circuit means;

a NAND gate having first and second inputs and an output, the first input being the output of the first NAND gate of the first circuit means, the second input being the output of the third NAND gate of the first circuit means;

a D-type flip-flop having a clock input, a reset, and output, the clock input being the output of the multiplexer, and the reset being the output of the NAND gate;

a first NOR gate having first and second inputs and an output, the first input being the output of the D-type flip-flop, the second input being coupled to the mode select of the multiplexer; and a second NOR gate having first and second inputs and an output, the first input being the output of the first NOR gate, the second input being coupled between the output of the AND gate of the first circuit means and the third inputs of the second and fourth NAND gates.

9. The dual-mode detector as recited in claim 4, wherein the third circuit means comprises:

a plurality of delay cells coupled in series, each delay cell being controlled by an input voltage signal to the voltage-controller oscillator.

10. The dual-mode detector as recited in claim 9, wherein each delay cell comprises:

an inverter having an input and an output, the input being the input to the delay cell and the output being the output to the delay cell;

a field-effect transistor having gate, drain, and source inputs, the drain input being coupled to the output of the inverter, and the gate being coupled to the input voltage signal to the voltage-controlled oscillator; and a capacitor having first and second inputs, the first input being coupled to the source of the field-effect transistor, and the second input being coupled to a predetermined voltage.

11. The dual-mode detector as recited in claim 5, wherein the third circuit means comprises:

a plurality of delay cells coupled in series, each delay cell being controlled by an input voltage signal to the voltage-controlled oscillator, and a predetermined number of delay cells having an output; and a multiplexer having inputs from the predetermined number of delay cells and a select input.

12. The dual-mode detector as recited in claim 11, wherein each delay cell comprises:

an inverter having an input and an output, the input being the input to the delay cell and the output being the output to the delay cell;

a field-effect transistor having gate, drain, and source inputs, the drain input being coupled to the output of the inverter, and the gate being coupled to the input voltage signal to the voltage-controlled oscillator; and a capacitor having first and second inputs, the first input being coupled to the source of the field-effect transistor, and the second input being coupled to a predetermined voltage.

13. The dual-mode detector as recited in claim 4 wherein the data signal comprises a Modified Frequency Modulation (MFM) encoded data signal.

14. The dual-mode detector as recited in claim 4, wherein the amount of delay comprises one-fourth of a bit cell.

15. The dual-mode detector as recited in claim 6, wherein the fourth circuit means comprises:

an XOR gate having first and second inputs and an output, the first input being the data signal; and a plurality of inverters coupled in series between the first input and the second input of the XOR gate.

16. In a phase-locked loop circuit having a voltage-controlled oscillator, a dual-mode detector comprising:

first circuit means for detecting phase differences between a data signal and a signal from the voltage-controlled oscillator during a phase-detection mode, for detecting phase and frequency differences between a clock signal and the signal from the voltage-controlled oscillator during a phase-and-frequency-detection mode, and for generating first and second feedback signals for controlling the voltage-controlled oscillator in response to the phase and frequency differences;

second circuit means for causing the first circuit means to switch between the phase-detection and the phase-and-frequency-detection modes of operation; and third circuit means for delaying signals from the second circuit means and for providing delayed signals to the first circuit means;

wherein the third circuit means is programmable;

wherein the dual-mode detector has a first gain while in the phase-detection mode and a second gain while in the phase-and-frequency-detection mode; and wherein the first and second gains are the same.

17. In a phase-locked loop circuit having a voltage-controlled oscillator, a dual-mode detector comprising:

first circuit means for detecting phase differences between a data signal and a signal from the voltage-controlled oscillator during a phase-detection mode, for detecting phase and frequency differences between a clock signal and the signal from the voltage-controlled oscillator during a phase-and-frequency-detection mode, and for generating first and second feedback signals for controlling the voltage-controlled oscillator in response to the phase and frequency differences;

second circuit means for causing the first circuit means to switch between the phase-detection and the phase-and-frequency-detection modes of operation; and third circuit means for converting predetermined data signals to a format recognizable by the first circuit means;

wherein the dual-mode detector has a first gain while in the phase-detection mode and a second gain while in the phase-and-frequency-detection mode; and wherein the first and second gains are the same.

18. In a phase-locked loop circuit having a voltage-controlled oscillator, a dual-mode detector comprising:

first circuit means for detecting phase differences between a data signal and a signal from the voltage-controlled oscillator during a phase-detection mode, for detecting phase and frequency differences between a clock signal and the signal from the voltage-controlled oscillator during a phase-and-frequency-detection mode, and for generating first and second feedback signals for controlling the voltage-controlled oscillator in response to the phase and frequency differences;

second circuit means for causing the first circuit means to switch between the phase-detection and the phase-and-frequency-detection modes of operation;

third circuit means for delaying signals from the second circuit means and for providing delayed signals to the first circuit means; and fourth circuit means for converting predetermined data signals to a format recognizable by the first circuit means;

wherein the third circuit means is programmable;

wherein the dual-mode detector has a first gain while in the phase-detection mode and a second gain while in the phase-and-frequency-detection mode; and wherein the first and second gains are the same.

19. A phase-locked loop circuit comprising:

a dual-mode detector which has phase-detection and phase-and-frequency-detection modes of operation;

wherein the dual-mode detector has a first gain while in the phase-detection mode and a second gain while in the phase-and-frequency-detection mode; and wherein the first and second gains are the same.

20. The phase-locked loop circuit as recited in claim 19, further comprising:

a voltage-controlled oscillator having an output signal coupled to the dual-mode detector;

a charge pump coupled to the output of the dual-mode detector; and a loop filter coupled between the charge pump and the voltage-controlled oscillator.

21. The phase-locked loop circuit as recited in claim 20, wherein the dual-mode detector comprises:

first circuit means for detecting phase differences between a first signal and a signal from the voltage-controlled oscillator during the phase-detection mode, for detecting phase and frequency differences between a second signal and the signal from the voltage-controlled oscillator during the phase-and-frequency-detection mode, and for generating first and second feedback signals for controlling the voltage-controlled oscillator in response to the phase and frequency differences; and second circuit means for causing the first circuit means to switch between the phase-detection and the phase-and-frequency-detection modes of operation.

22. The phase-locked loop circuit as recited in claim 21, wherein the first signal is a data signal and the second signal is a clock signal.

23. The phase-locked loop circuit as recited in claim 22, wherein the dual-mode detector further comprises:

third circuit means for delaying signals from the second circuit means and for providing delayed signals to the first circuit means.

24. The phase-locked loop circuit as recited in claim 23, further comprising:

a frequency divider for dividing the frequency of the output signal from the voltage-controlled oscillator by a predetermined number and for providing an output signal having the quotient frequency to the first circuit means.

25. The phase-locked loop circuit as recited in claim 24, wherein the third circuit means and the frequency divider are programmable.

26. The phase-locked loop circuit as recited in claim 23, wherein the dual-mode detector further comprises:

fourth circuit means for converting predetermined data signals to a format recognizable by the first circuit means.

27. The phase-locked loop circuit as recited in claim 21, wherein the first circuit means comprises:

a first NAND gate having first and second inputs and an output, the first input being either the first or second signal;

a second NAND gate having first, second, and third inputs and an output, the first input being the output of the first NAND gate, and the output being the first feedback signal and the second input of the first NAND gate;

a first RS-type flip-flop having an input, a reset, and an output, the input being the output of the first NAND gage, the output being the second input of the second NAND gate, and the reset being the third input of the second NAND gate;

a third NAND gate having first and second inputs and an output, the first input being the output of the voltage-controlled oscillator;

a fourth NAND gate having first, second, and third inputs and an output, the first input being the output of the third NAND gate, and the output being the second feedback signal and the second input of the third NAND gate;

a second RS-type flip-flop having an input, a reset, and an output, the input being the output of the third NAND gate, the output being the second input of the fourth NAND gate, and the reset being the third input of the second and fourth NAND gates; and an AND gate having first, second, third, and fourth inputs and an output, the first input being the output of the first NAND gate, the second input being the output of the first RS-type flip-flop, the third input being the output of the second RS-type flip-flop, the fourth input being the output of the third NAND gate, and the output being the third input of the second and fourth NAND gates.

28. The phase-locked loop circuit as recited in claim 27, wherein the second circuit means comprises:

a multiplexer having first, second, and mode select inputs and an output, the first input being the first signal, the second input being the second signal, and the output being the first input to the first NAND gate of the first circuit means;

a NAND gate having first and second inputs and an output, the first input being the output of the first NAND gate of the first circuit means, the second input being the output of the third NAND gate of the first circuit means;

a D-type flip-flop having a clock input, a reset, and output, the clock input being the output of the multiplexer, and the reset being the output of the NAND gate;

a first NOR gate having first and second inputs and an output, the first input being the output of the D-type flip-flop, the second input being coupled to the mode select of the multiplexer; and a second NOR gate having first and second inputs and an output, the first input being the output of the first NOR gate, the second input being coupled between the output of the AND gate of the first circuit means and the third inputs of the second and fourth NAND gates.

29. The phase-locked loop circuit as recited in claim 23, wherein the third circuit means comprises:
    a plurality of delay cells coupled in series, each delay cell being controlled by an input voltage signal to the voltage-controlled oscillator.

30. The phase-locked loop circuit as recited in claim 29, wherein each delay cell comprises:
    an inverter having an input and an output, the input being the input to the delay cell and the output being the output to the delay cell;
    a field-effect transistor having gate, drain, and source inputs, the drain input being coupled to the output of the inverter, and the gate being coupled to the input voltage signal to the voltage-controlled oscillator; and
    a capacitor having first and second inputs, the first input being coupled to the source of the field-effect transistor, and the second input being coupled to a predetermined voltage.

31. The phase-locked loop circuit as recited in claim 25, wherein the third circuit means comprises:
    a plurality of delay cells coupled in series, each delay cell being controlled by an input voltage signal to the voltage-controlled oscillator, and a predetermined number of delay cells having an output; and
    a multiplexer having inputs from the predetermined number of delay cells and a select input.

32. The phase-locked loop circuit as recited in claim 31, wherein each delay cell comprises:
    an inverter having an input and an output, the input being the input to the delay cell and the output being the output to the delay cell;
    a field-effect transistor having gate, drain, and source inputs, the drain input being coupled to the output of the inverter, and the gate being coupled to the input voltage signal to the voltage-controlled oscillator; and
    a capacitor having first and second inputs, the first input being coupled to the source of the field-effect transistor, and the second input being coupled to a predetermined voltage.

33. The phase-locked loop circuit as in claim 24 wherein the data signal comprises a Modified Frequency Modulation (MFM) encoded data signal and the predetermined number comprises four.

34. The phase-locked loop circuit as recited in claim 23, wherein the amount of delay comprises one-fourth of a bit cell.

35. The phase-locked loop circuit as recited in claim 26, wherein the fourth circuit means comprises:
    an XOR gate having first and second inputs and an output, the first input being the data signal; and
    a plurality of inverters coupled in series between the first input and the second input of the XOR gate.

36. A phase-locked loop circuit comprising:
    a voltage-controlled oscillator;
    a loop filter coupled to the voltage-controlled oscillator;
    a charge pump coupled to the loop filter;
    a dual-mode detector, coupled between the voltage-controlled oscillator and the charge pump, and which has phase-detection and phase-and-frequency-detection modes of operation, including first circuit means for detecting phase differences between a data signal and a signal from the voltage-controlled oscillator during the phase-detection mode, for detecting phase and frequency differences between a clock signal and the signal from the voltage-controlled oscillator during the phase-and-frequency-detection mode, and for generating first and second feedback signals for controlling the voltage-controlled oscillator in response to the phase and frequency differences; second circuit means for causing the first circuit means to switch between the phase-detection and the phase-and-frequency-detection modes of operation; third circuit means for delaying signals from the second circuit means and for providing delayed signals to the first circuit means; and
    a frequency divider for dividing the frequency of the output signal from the voltage-controlled oscillator by a predetermined number and for providing an output signal having the quotient frequency to the first circuit means;
    wherein the dual-mode detector has a first gain while in the phase-detection mode and a second gain while in the phase-and-frequency-detection mode; and
    wherein the first and second gains are the same.

* * * * *